US010057508B2

(12) United States Patent
Falcone et al.

(10) Patent No.: US 10,057,508 B2
(45) Date of Patent: Aug. 21, 2018

(54) ILLUMINATION DEVICE WITH INTEGRATED THERMAL IMAGING SENSOR

(71) Applicant: Excelitas Technologies Corp., Waltham, MA (US)

(72) Inventors: Joel Falcone, Dublin, CA (US); Rudi Blondia, Fremont, CA (US); Arthur John Barlow, Alton (GB)

(73) Assignee: Excelitas Technologies Corp., Waltham, MA (US)

( * ) Notice: Subject to any disclaimer, the term of this patent is extended or adjusted under 35 U.S.C. 154(b) by 0 days.

(21) Appl. No.: 14/296,564

(22) Filed: Jun. 5, 2014

(65) Prior Publication Data

US 2014/0374602 A1 Dec. 25, 2014

Related U.S. Application Data (60) Provisional application No. 61/837,357, filed on Jun. 20, 2013.

(51) Int. Cl.
| | | |
|---|---|---|
| *H04N 5/33* | (2006.01) | |
| *H05B 37/02* | (2006.01) | |
| *H01L 27/146* | (2006.01) | |
| *H01L 31/16* | (2006.01) | |
| *H05B 33/08* | (2006.01) | |

(52) U.S. Cl.
CPC ............ *H04N 5/33* (2013.01); *H01L 27/146* (2013.01); *H01L 31/16* (2013.01); *H05B 33/0803* (2013.01); *H05B 37/0272* (2013.01)

(58) Field of Classification Search
CPC ....................................................... H04N 5/33
See application file for complete search history.

(56) References Cited

U.S. PATENT DOCUMENTS

| | | |
|---|---|---|
| D466,429 S | 12/2002 | Sandell et al. |
| 6,900,729 B2 | 5/2005 | Paximadis et al. |
| 6,958,689 B2 | 10/2005 | Anderson et al. |
| 7,119,334 B2 | 10/2006 | Secundo et al. |
| 7,321,119 B2 | 1/2008 | King et al. |
| 7,381,953 B1 | 6/2008 | Kaufman et al. |
| 7,411,497 B2 | 8/2008 | Kates |
| 7,422,365 B2 | 9/2008 | Chamberlain et al. |

(Continued)

FOREIGN PATENT DOCUMENTS

| | | |
|---|---|---|
| DE | 3622025 C1 | 10/1987 |
| EP | 2045510 A2 | 4/2009 |

(Continued)

OTHER PUBLICATIONS

European Search Report for Application 14172838 dated Jul. 22, 2015.

*Primary Examiner* — Edwin Gunberg (74) *Attorney, Agent, or Firm* — Peter A. Nieves; Sheehan Phinney Bass & Green PA (57) ABSTRACT

An illumination device with an integrated thermal imaging sensor and method for using the same are disclosed. The device includes a solid state illumination source, and a thermal imager comprising a multi-pixel heat sensing device. A controller is configured to control the thermal imager, and a power source is configured to supply power to the illumination source, the thermal imager, and the controller.

13 Claims, 6 Drawing Sheets

(56) References Cited

U.S. PATENT DOCUMENTS

| | | |
|---|---|---|
| 7,498,576 B2 | 3/2009 | Micko |
| 7,561,255 B1 | 7/2009 | Billmers et al. |
| 7,626,506 B2 | 12/2009 | Antonio, II et al. |
| 7,795,583 B1 | 9/2010 | Hubbard et al. |
| 7,977,634 B2 | 6/2011 | Thiele et al. |
| 8,003,941 B1* | 8/2011 | Heinke ............... G01J 5/02 250/330 |
| 8,206,005 B2* | 6/2012 | Czajkowski ........... F21V 29/70 362/240 |
| 2006/0132643 A1* | 6/2006 | Chang ............. G08B 13/19619 348/373 |
| 2007/0260429 A1 | 11/2007 | Vera et al. |
| 2007/0285510 A1* | 12/2007 | Lipton ............... G08B 13/1961 348/135 |
| 2009/0091444 A1* | 4/2009 | Hierzer ............... F21S 2/00 340/541 |
| 2010/0214099 A1 | 8/2010 | Icove et al. |
| 2010/0264853 A1 | 10/2010 | Amutham |
| 2011/0140892 A1 | 6/2011 | Chen et al. |
| 2012/0105229 A1 | 5/2012 | Kates et al. |
| 2012/0281083 A1 | 11/2012 | Chivers et al. |
| 2012/0287245 A1 | 11/2012 | Holland et al. |
| 2012/0287271 A1 | 11/2012 | Holland et al. |
| 2012/0306942 A1 | 12/2012 | Fujiwara et al. |
| 2012/0320215 A1 | 12/2012 | Maddi |
| 2013/0056637 A1* | 3/2013 | Miyashita ............... G01J 5/024 250/338.3 |

FOREIGN PATENT DOCUMENTS

| | | |
|---|---|---|
| FR | 2975461 A1 | 11/2012 |
| WO | 2011055259 A1 | 5/2011 |

* cited by examiner

ILLUMINATION DEVICE WITH INTEGRATED THERMAL IMAGING SENSOR

CROSS-REFERENCE TO RELATED APPLICATIONS

This application claims the benefit of U.S. Provisional Patent Application Ser. No. 61/837,357, filed Jun. 20, 2013, entitled "Illumination Device with Integrated Thermal Imaging Sensor" which is incorporated by reference herein in its entirety.

FIELD OF THE INVENTION

The present invention relates to semiconductor sensors and more particularly, is related to thermal imaging sensors.

BACKGROUND OF THE INVENTION

Smart lighting fixtures combine illumination capabilities with a wired or wireless control signaling means. Solid state lighting technologies including illumination based on semiconductor light sources, such as light-emitting diodes (LEDs), offer a viable alternative to traditional fluorescent, high intensity discharge (HID) lamps, and incandescent lamps. Functional advantages and benefits of LEDs include high energy conversion and optical efficiency, durability, lower operating costs, and many others. Recent advances in LED technology have provided efficient and robust full-spectrum lighting sources that enable a variety of lighting effects in many applications. An external controller communicates with one or more fixtures via the signaling means.

Thermal monitoring of homes and businesses has many applications. Prior art multi-pixel thermal imaging devices are capable of not just detecting the presence of heat/motion, in particular, human activity, but also providing resolution sufficient to determine the location, position, direction and/or distance of that activity with respect to the sensor, and the relative magnitude of the activity. For example, the resolution of the imaging device may distinguish an open flame or heat source from human body temperature, presence of intruders, correct location of people, for example, children asleep in bed, etc. Further, the resolution of the multi-pixel thermal imaging devices may be sufficient to distinguish between different heat intensity regions or the location of an incapacitated person during a fire.

One barrier to implementing premises wide thermal monitoring is the cost. Thermal imaging devices and arrays are often expensive themselves, and even more so when coupled with the power and control infrastructure needed to implement them. Therefore, there is a need in the industry to overcome the abovementioned shortcomings.

SUMMARY OF THE INVENTION

Embodiments of the present invention provide an illumination device with an integrated thermal imaging sensor. Briefly described, the present invention is directed to an illumination device with an integrated thermal imaging sensor. The device can include some or all of: a solid state illumination source, a thermal imager comprising a multi-pixel heat sensing device, an illumination controller configured to control the solid state illumination source. A thermal imager controller is configured to control the thermal imager, and a power source is configured to supply power to the illumination source, the thermal imager, the illumination controller, and the thermal imager controller.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principals of the invention.

DETAILED DESCRIPTION

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

As used herein for purposes of the present disclosure, the term "LED" should be understood to include any electroluminescent diode or other type of carrier injection/junction-based system that is capable of generating radiation in response to an electric signal. Thus, the term LED includes, but is not limited to, various semiconductor-based structures that emit light in response to current, light emitting polymers, organic light emitting diodes (OLEDs), electroluminescent strips, lasers, SLEDs, and the like. For example, one implementation of an LED configured to generate essentially white light (for example, a white LED) may include a number of dies which respectively emit different spectra of electroluminescence that, in combination, mix to form essentially white light. In another implementation, a white light LED may be associated with a phosphor material that converts electroluminescence having a first spectrum to a different second spectrum. In one example of this implementation, electroluminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectra of radiation (for example, an LED that may or may not be individually controllable). Also, an LED may be associated with a phosphor that is considered as an integral part of the LED (for example, some types of white LEDs). In general, the term LED may refer to packaged LEDs, non-packaged LEDs, surface mount LEDs, chip-on-board LEDs, T-package mount LEDs, radial package LEDs, power package LEDs, LEDs including some type of encasement and/or optical element (for example, a diffusing lens), The term "light source" should be understood to refer to any one or more of a variety of radiation sources, including, but not limited to, LED-based sources (including one or more LEDs as defined above). In general, a light source refers to a device producing visible radiation used to illuminate objects in a region in proximity to the light source, rather than an object that merely emits light, such as an LED indicator.

The term "lighting fixture" is used herein to refer to an implementation or arrangement of one or more lighting units in a particular form factor, assembly, or package. The term "lighting unit" is used herein to refer to an apparatus including one or more light sources of same or different types. A given lighting unit may have any one of a variety of mounting arrangements for the light source(s), enclosure/housing arrangements and shapes, and/or electrical and mechanical connection configurations. Additionally, a given lighting unit optionally may be associated with various other components (for example, control circuitry) relating to the operation of the light source(s).

The terms "thermal imaging sensor", "thermal imager," "thermal sensor," and "heat sensing device," as each used herein to mean any kind of multi-pixel sensor capable of forming a thermal signature or image within a detection field of the sensor ("the observed area"). This can include all kinds of infra-red sensor technologies such as bolometers, thermopiles and pyro-electric devices, and in any arrangement of two or more independent pixels to form a representation of the infra-red radiation level within the sensed area, and thereby infer the presence, location, position, speed and direction of movement, temperature and size of any warm or hot objects which naturally radiate long-wavelength (8-12 µm) infra-red radiation, within the sensing area.

The term "controller" is used herein generally to describe various apparatus relating to the operation of one or more light sources. A controller can be implemented in numerous ways (for example, with dedicated hardware) to perform various functions discussed herein. A "processor" is one example of a controller which employs one or more microprocessors that may be programmed using software (for example, microcode) to perform various functions discussed herein. A controller may be implemented with or without employing a processor, and also may be implemented as a combination of dedicated hardware to perform some functions and a processor (for example, one or more programmed microprocessors and associated circuitry) to perform other functions. Examples of controller components that may be employed in various embodiments of the present disclosure include, but are not limited to, conventional microprocessors, application specific integrated circuits (ASICs), and field-programmable gate arrays (FPGAs).

In various implementations, a processor or controller may be associated with one or more storage media (generically referred to herein as "memory," for example, volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein. The terms "program" or "computer program" are used herein in a generic sense to refer to any type of computer code (for example, software or microcode) that can be employed to program one or more processors or controllers.

The term "user interface" as used herein refers to an interface between a human user or operator and one or more devices that enable communication between the user and the device(s). Examples of user interfaces that may be employed in various implementations of the present disclosure include, but are not limited to, switches, potentiometers, buttons, dials, sliders, a mouse, keyboard, keypad, various types of game controllers, joysticks, track balls, display screens, various types of graphical user interfaces (GUIs), touch screens, microphones and other types of sensors that may receive some form of human-generated stimulus and generate a signal in response thereto. A user interface may be local to the device, such as a direct wired user interface, or may be remote from the device, such as a wired switch or a wireless controller.

Reference will now be made in detail to embodiments of the present invention, examples of which are illustrated in the accompanying drawings. Wherever possible, the same reference numbers are used in the drawings and the description to refer to the same or like parts.

As noted above, the expense of thermal imaging devices and associated power and control infrastructure needed to implement them are problematic. However, costs for a thermal imaging system may be mitigated as per embodiments of the present invention in part by implementing the thermal devices to share control and power infrastructure with existing control and power systems generally present in most building, for example, lighting and/or environmental control systems. Combining thermal and lighting facilities in particular may be beneficial, as lighting fixtures are generally positioned to provide optimum illumination coverage, which generally coincides with an unobstructed vantage point for thermal detection. Furthermore, the value of the thermal image may be such as to overcome the expense issues.

The present invention incorporates a multi-pixel thermal imaging device into a smart lighting fixture such that the imaging device leverages the power and signaling of the smart lighting fixture, but may be operated substantially independently of the lighting features.

Figure 1:
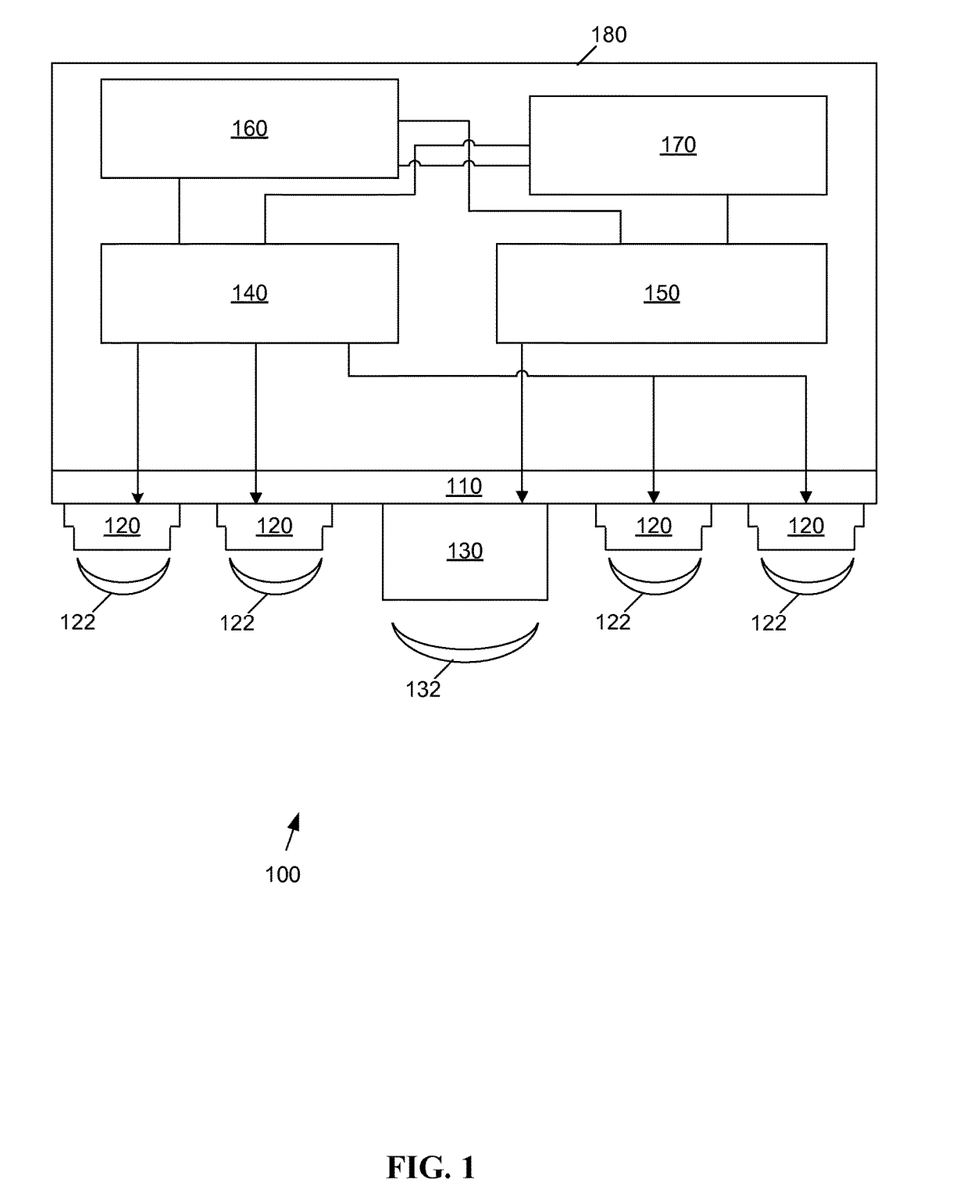
FIG. 1 is a schematic diagram of an exemplary first embodiment of an integrated lighting fixture and thermal imager.

FIG. 1 is a schematic diagram of an exemplary embodiment of an integrated lighting fixture and thermal imager device 100. The integrated lighting fixture and thermal imager device 100 includes a heat sensing device 130 and a plurality of light sources 120 mounted on a substrate 110. The heat sensing device 130 may be a thermal imaging sensor, and may include, for example, one or a more of gyro sensors, thermopiles, and/or bolometers in a one dimensional (1D), scanned 1D, or two dimensional (2D) array, in a single integrated module or discrete components, preferably implemented on the same substrate 110.

The sensing field of the heat sensing device 130 may be independently configured from the region illuminated by the plurality of light sources 120. In general, it may be desirable for the sensing field of the heat sensing device 130 to coincide with the region illuminated by the plurality of light sources 120. Alternatively, the sensing field of the heat sensing device 130 may only partially overlap with the region illuminated by the plurality of light sources 120, or the sensing field of the heat sensing device 130 may not overlap with the region illuminated by the plurality of light sources 120 at all. For example, the sensing field of the heat sensing device 130 may be a subset of the region illuminated by the plurality of light sources 120, or the region illuminated by the plurality of light sources 120 may be a subset of the sensing field of the heat sensing device 130.

The substrate 110 may be, for example, a printed circuit board. The substrate 110 is preferably a highly thermally conductive and electrically insulating structure which provides mechanical support, such as a plate, package, or form, to which the plurality of light sources 120 and/or a heat sensing device 130 may be mounted. For example, the substrate 110 material may be formed of a material that provides high thermal conductivity and electrical insulation. In another example, the core material of the substrate 110 may provide high thermal conductivity properties, coupled with an electrically insulating layer. The substrate 110 includes electrically conductive material of the surface, for example, upon the insulating layer, such as LED attachment pads and other contact points for electrical connection of other electronic components.

The light sources 120 and heat sensing device 130 may share the same power connection to a power supply grid 160. The power supply grid 160 may supply alternating current (AC) or direct current (DC), where a DC power supply grid may be or include a battery back-up (not shown). A lighting controller 140 is a circuit that controls the operation of the light sources 120. The lighting controller 140 may also read the status or state of the light sources 120. The lighting controller 140 of the integrated lighting fixture and thermal imager device 100 may control parameters such as turning a light source 120 on and off, the illumination level of the light source 120, and quality of light emitted by the light source 120, for example color and focus, among other lighting parameters. State information read from the light sources 120 by the lighting controller 140 may include on/off state, temperature state, power consumption, among others. The lighting controller 140 may be omitted in alternative embodiments, for example, in embodiments where the light sources 120 are controlled entirely via presence or absence of power.

A thermal imager controller 150 controls operating parameters for the one or more heat sensing devices 130. State information read from the heat sensing device 130 by the thermal imager controller 150 may include heat sensor data, and change of state indication, among others.

The lighting controller 140 and the thermal imager controller 150 generally operate independently. For example, activity of the lighting controller 140 may have no bearing on activity of the thermal imager controller 150. The lighting controller 140 and the thermal imager controller 150 may be two physically separate entities, for example, two separate microprocessors. Alternatively, the lighting controller 140 and the thermal imager controller 150 may be independent processes or sub-processes executed on the same physical processor, for example, a microprocessor device. Other configurations of independent controllers familiar to persons having ordinary skill in the art are possible.

Both the lighting controller 140 and the thermal imager controller 150 may or may not share the same communication interface 170. The communication interface 170 may communicate over one or more types of communications infrastructure, for example, wireless infrastructure, discretely wired infrastructure, or communication-over-grid infrastructure, among other communication structures. The communication interface 170 may be used to receive commands via the communication infrastructure, and the communication interface 170 may route the received commands to the thermal imager controller 150 and/or the lighting controller 140. For example, sensor commands and lighting commands may be separately addressed, or may be tagged with distinguishable command op-codes to facilitate routing of the commands to the appropriate controller 140, 150.

The power supply grid 160, the communication interface 170, the lighting controller 140, and the thermal imager controller 150 are contained within a housing 180. The housing 180 may also contain the substrate 110. In alternative embodiments, one or more of power supply grid 160, the communication interface 170, the lighting controller 140, the thermal imager controller 150, and the substrate 110 may be located externally to the housing 180, for example, in a second housing (not shown).

Each light source 120 may include illumination optics 122, for example, a lens, a mirror, or diffuser, to define and/or control the radiation path for radiated illumination produced by the light source 120. Similarly, the heat sensing device 130 may include thermal optics 132 to define/control the field of view of radiation, thereby improving sensor performance and/or sensitivity. For example, thermal optics 132 may include a filter to include or exclude specific radiation wavelengths. Under the first embodiment, there is no established relationship between radiated illumination coverage and detected thermal radiation coverage, unlike some prior art security devices that need light provided by light sources to detect thermal radiation.

While FIG. 1 shows one heat sensing device 130 and multiple light sources 120 attached to a single substrate 110, alternative embodiments may have two or more heat sensing devices 130 and one or more light sources 120 attached to one or more substrates 110 within the housing 180.

Figure 2:
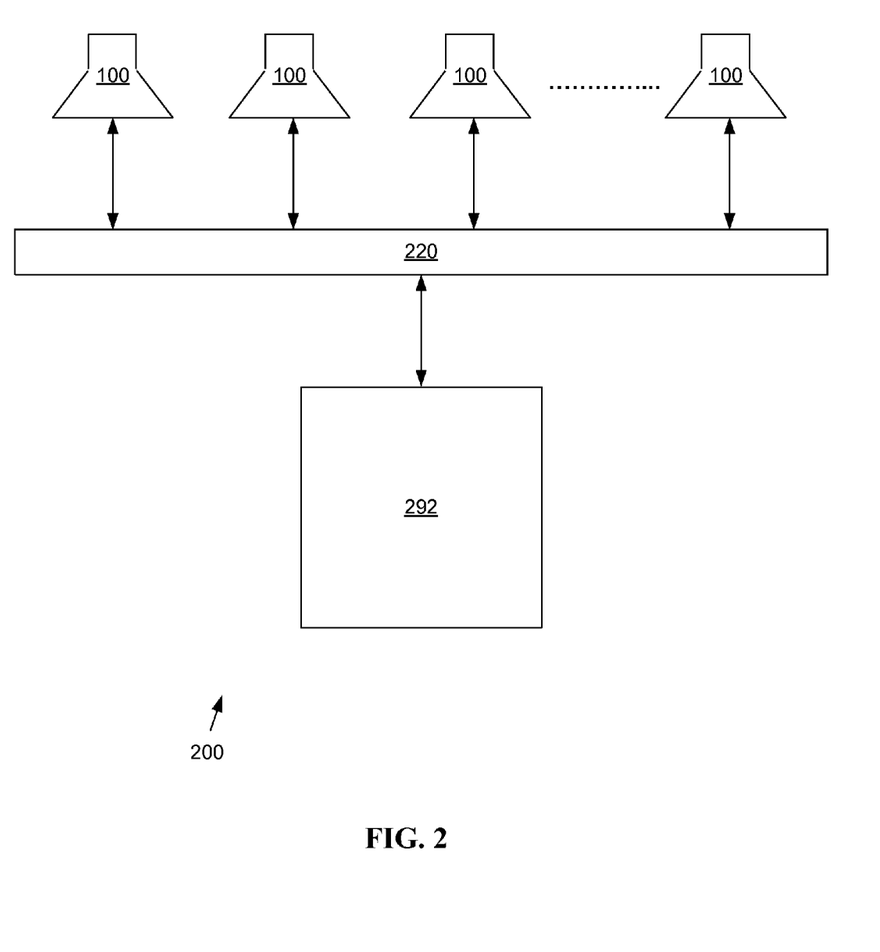
FIG. 2 is a block diagram of an exemplary first embodiment of a system of integrated lighting and thermal imager devices.

FIG. 2 is a schematic diagram of an exemplary first embodiment of a system 200 of lighting fixtures integrated with thermal imagers. Two or more integrated lighting fixture and thermal imager devices 100 may be in communication with a central building control system 220. The building control system 220 is in communication with each integrated lighting fixture and thermal imager device 100, allowing the building control system 220 to operate illumination and sensor features of the integrated lighting fixture and thermal imager devices 100 in a networked fashion for combined illumination control and heat sensing feedback. Such control includes interacting with thermal imaging capabilities of the integrated lighting fixture and thermal imager device 100. As noted above, the building control system 220 may be in communication with the communication interface 170 (FIG. 1) of the integrated lighting fixture and thermal imager device 100 via wired and/or wireless communication infrastructure.

While FIG. 2 represents the building control system 220 as a single unit, alternative embodiments may distribute various functions of the building control system 220 over two or more devices and/or structures that integrate to form the building control system 220.

A user interface 292 is used to program, configure, and/or request status of the overall control system 220. The user interface 292 may be hosted in one of several devices, wired or wireless, for example, a computer, a smart phone, a tablet computer, a wall mounted touch screen interface, and a voice controller, among other such devices familiar to person having ordinary skill in the art. The user interface 250 may present a graphical user interface (GUI), or may provide physical controls, for example, knobs, switches and sliders for controlling parameters of the devices 100.

Figure 3:
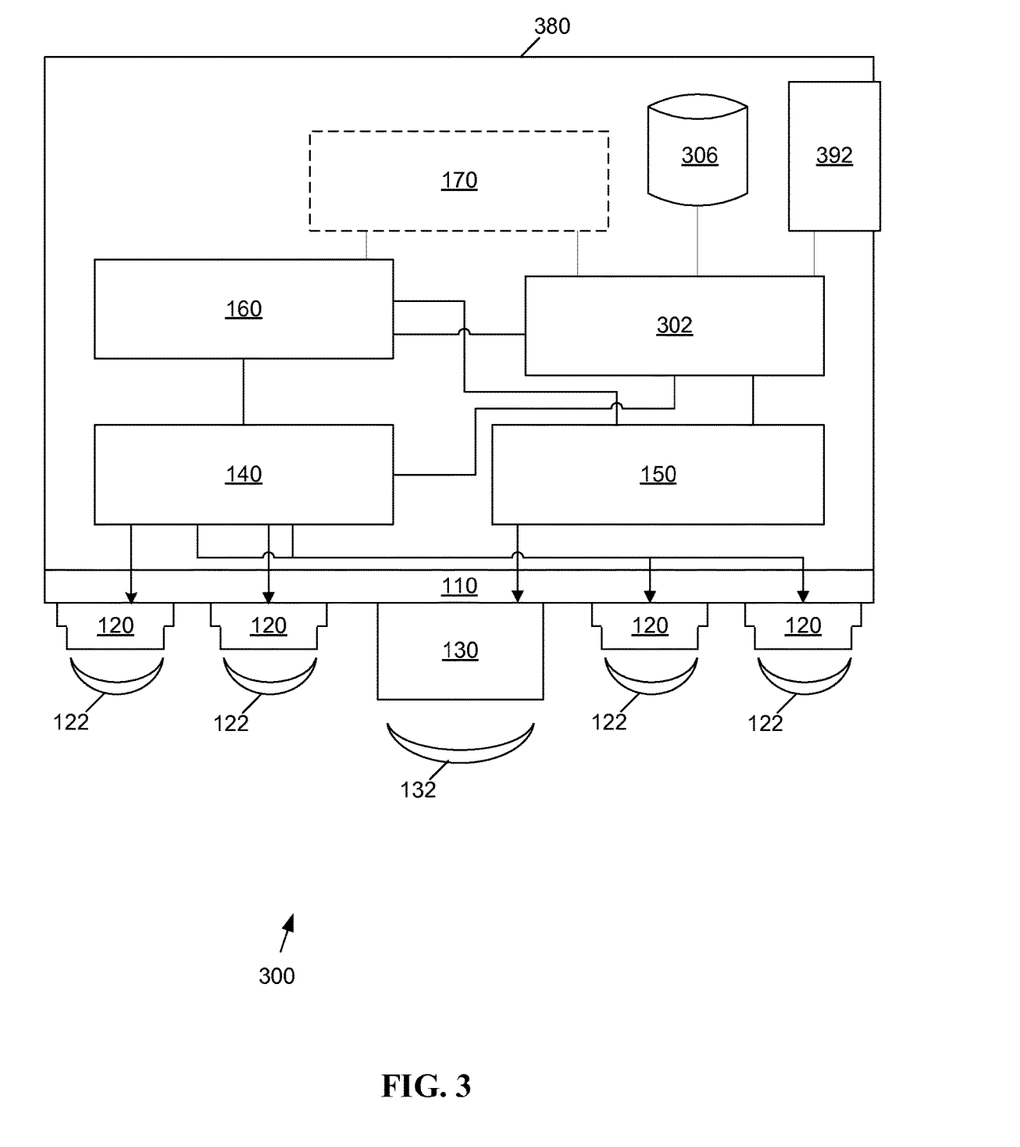
FIG. 3 is a schematic diagram of an exemplary second embodiment of an integrated lighting fixture and thermal imager.

FIG. 3 is a schematic diagram of an exemplary second embodiment of an integrated lighting fixture and thermal imager device 300, including an internal processor 302, a memory 306, and a user interface 392. The integrated lighting fixture and thermal imager device 300 includes a heat sensing device 130 and a plurality of light sources 120 mounted on a substrate 110. The heat sensing device 130 may be a thermal imaging sensor, and may include, for example, one or a more of gyro sensors, thermopiles, and/or bolometers in a one dimensional (1D), scanned 1D, or two dimensional (2D) array, in a single integrated module or discrete components, preferably implemented on the same substrate 110.

The substrate 110 may be, for example, a printed circuit board. The substrate 110 is preferably a highly thermally conductive and electrically insulating structure which provides mechanical support, such as a plate, package, or form, to which the plurality of light sources 120 and/or a heat sensing device 130 may be mounted. For example, the substrate 110 material may be formed of a material that provides high thermal conductivity and electrical insulation. In another example, the core material of the substrate 110 may provide high thermal conductivity properties, coupled with an electrically insulating layer. The substrate 110 includes electrically conductive material of the surface, for example, upon the insulating layer, such as LED attachment pads and other contact points for electrical connection of other electronic components.

The light sources 120 and heat sensing device 130 may share the same power connection to a power supply grid 160. The power supply grid 160 may supply alternating current (AC) or direct current (DC), where a DC power supply grid may be or include a battery back-up (not shown). A lighting controller 140 is a circuit that controls the operation of the light sources 120. The lighting controller 140 of the integrated lighting fixture and thermal imager device 300 may control parameters such as turning a light source 120 on and off, the illumination level of the light source 120, and quality of light emitted by the light source 120, for example color and focus, among other lighting parameters. The lighting controller 140 may be omitted in alternative embodiments. A thermal imager controller 150 controls operating parameters for the one or more heat sensing devices 130.

The processor 302 may accept external commands, for example, via the communication interface 170, or may operate via software stored locally, for example, in memory 306. The processor 302 may be in communication with the lighting controller 140 and/or the thermal imager controller 150.

The lighting controller 140 and the thermal imager controller 150 generally operate independently. For example, activity of the lighting controller 140 may have no bearing on activity of the thermal imager controller 150. The lighting controller 140 and the thermal imager controller 150 may be two physically separate entities, for example, two separate microprocessors. Alternatively, the lighting controller 140 and the thermal imager controller 150 may be independent processes or sub-processes executed on the processor 302, for example, a microprocessor device. The processor 302 may be used to coordinate functions of the lighting controller 140 and the thermal imager controller 150. For example, detection of a thermal event by the thermal imager controller 150 may cause the processor to change the function of the lighting controller 140. For example, the detection of a warm object by the thermal imager controller 150 as sensed by the heat sensing device 130 may cause the processor 302 to change the illumination level of one or more light source 120 via the lighting controller 140.

The processor 302 may log activity of connected components, for example, events sensed by the thermal imager controller 150, or commands received by the user interface 392 or communication interface 170. Logged events may be time stamped, for example, via an onboard timing source (not shown), or by a network clock received by the communication interface 170. The activity log may be stored in the memory 306. Other configurations of independent controllers familiar to persons having ordinary skill in the art are possible.

Under the second embodiment, the communication interface 170 may be optional, so that operation of the thermal imaging device is self-contained, for example, controlled by the processor 302 via the user interface 392. The user interface 392 may be a physical interface accessible via the surface of the housing 380, for example, having physical controls such as, but not limited to, switches, faders and rotary knobs, a touch pad interface, or one or more ports providing access to an external I/O device, for example, a smart phone or tablet computer. The user interface 392 may also be provided through a remote device.

Remote control may be provided wirelessly, for example, via the communication interface 170. Both the lighting controller 140 and the thermal imager controller 150 may share the same communication interface 170, or may be indirectly connected to the communication interface 170 by the processor 302. The communication interface 170 may communicate over one or more types of communications infrastructure, for example, wireless infrastructure using known wireless communication protocols such as Bluetooth or Zigbee, or a custom communication protocol, discretely wired infrastructure, or communication-over-grid infrastructure, among other communication structures. The communication interface 170 may be used to receive commands via the communication infrastructure, and the communication interface 170 may route the received commands to the thermal imager controller 150 and/or the lighting controller 140. For example, sensor commands and lighting commands may be separately addressed, or may be tagged with distinguishable command op-codes to facilitate routing of the commands to the appropriate controller 140, 150.

The power supply grid 160, the communication interface 170, the lighting controller 140, the processor 302, the memory 306, the user interface 392 and the thermal imager controller 150 may all be contained within a housing 380. The housing 380 may also contain the substrate 110. In alternative embodiments, one or more of power supply grid 160, the communication interface 170, the lighting controller 140, the thermal imager controller 150, and the substrate 110 may be located externally to the housing 380, for example, in a second housing (not shown).

Each light source 120 may include illumination optics 122, for example, a lens, a mirror, or diffuser, to define and/or control the radiation path for radiated illumination produced by the light source 120. Similarly, the heat sensing device 130 may include thermal optics 132 to define/control the field of view of radiation, thereby improving sensor performance and/or sensitivity. For example, thermal optics 132 may include a filter to include or exclude specific radiation wavelengths. Under the second embodiment, there is no established relationship between radiated illumination coverage and detected thermal radiation coverage, unlike some prior art security devices that need light provided by light sources to detect thermal radiation.

While FIG. 3 shows one heat sensing device 130 and multiple light sources 120 attached to a single substrate 110, alternative embodiments may have two or more heat sensing devices 130 and one or more light sources 120 attached to one or more substrates 110 within the housing 380.

Figure 4A:
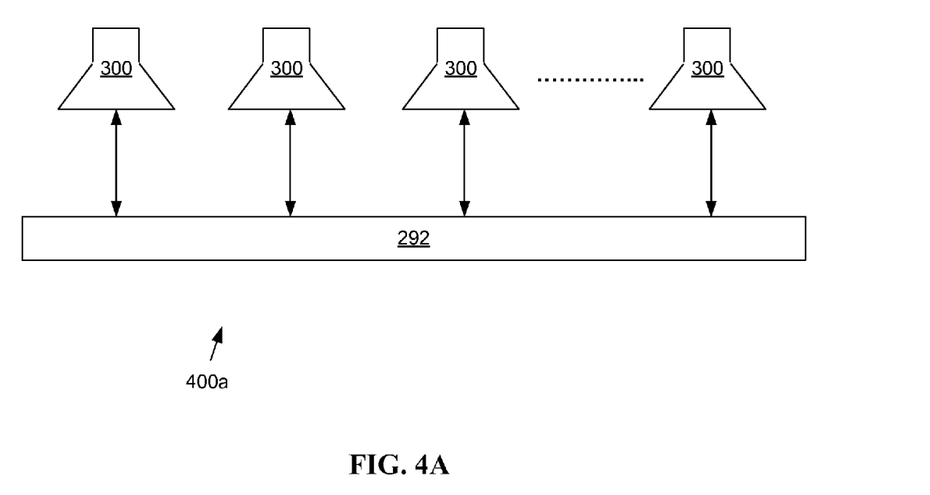
FIG. 4A is a block diagram of an exemplary second embodiment of a system having an integrated lighting fixture and thermal imager devices.

In a second system embodiment, shown by FIG. 4A, the building control system 400*a* is not provided as a separate external device, but is instead incorporated as a distributed system operated via the processors 302 (FIG. 3) within each of the individual integrated lighting fixture and thermal imager devices 300.

Figure 4B:
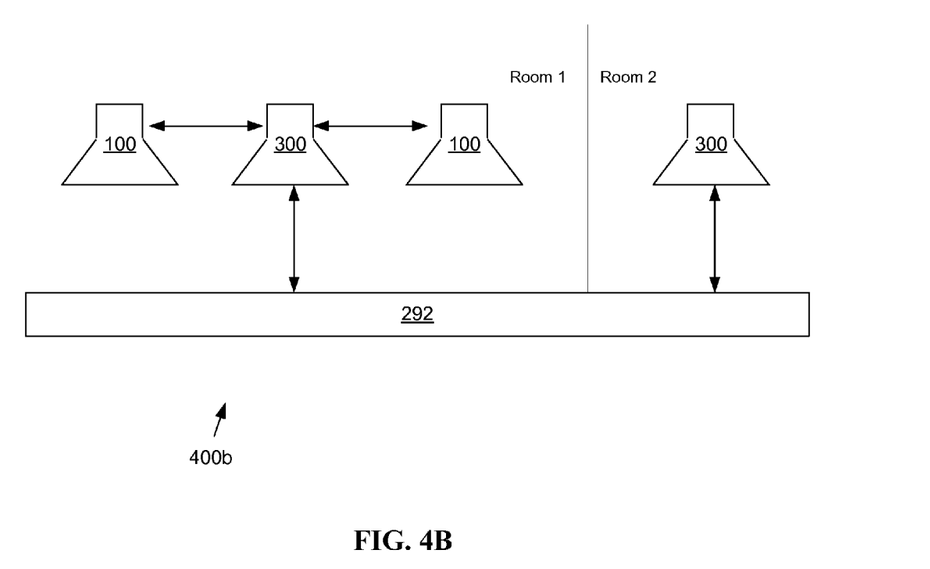
FIG. 4B is a block diagram of a variation of the second embodiment of the system of FIG. 4A.

In a variation of the second system embodiment, shown by FIG. 4B, the building control system 400*b* is similarly not part of an separate external device, but is instead a distributed system operated by the processors 302 (FIG. 3) within some of the individual integrated lighting fixture and thermal imager devices 300 ("master devices") while other individual integrated lighting fixtures 100 are "slave devices," for example, as described in the first embodiment, having reduced processing capacity and operating under the control of the master devices 300. As shown in FIG. 4B, an exemplary system 400*b* may have a first master device 300 in a first room controlling zero or more slave devices 100 within the first room, and a second master device 300 in a second room. It may be desirable to have all of the slave devices 100 under the control of a master device 300 to behave similarly to the master device 300, for example, providing the same level of illumination, or each slave device 100 may be individually controlled to have individual lighting levels as controlled by the master device 300. This arrangement may reduce system costs, as a slave device 100 may be less costly to produce than a master device 300 with a processor 302 (FIG. 3).

Figure 5:
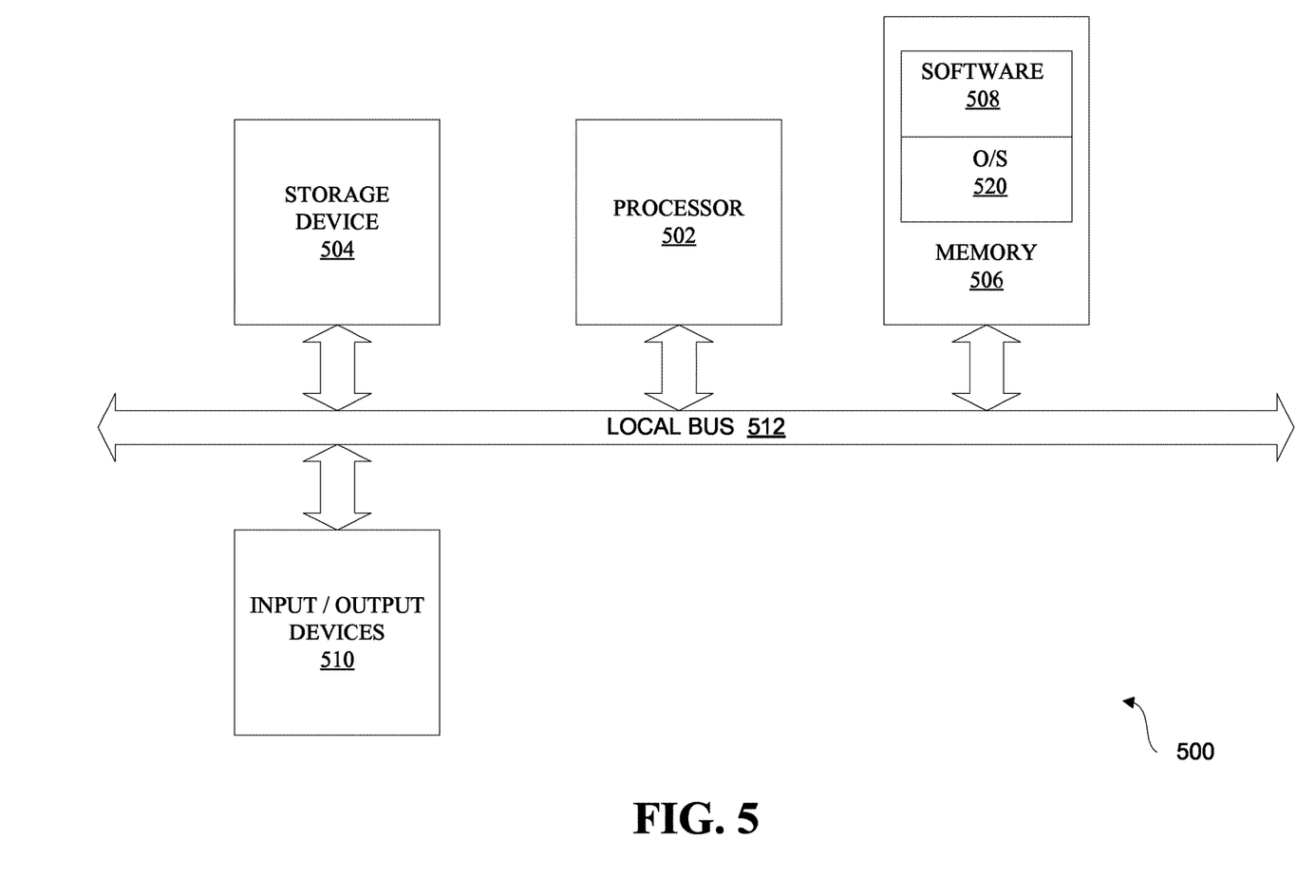
FIG. 5 is a schematic diagram illustrating an example of a system for executing functionality of the present invention.

The combined functionality of components described above form a system 500, an example of which is shown in the schematic diagram of FIG. 5. For example the functionality of the communication interface 170 (FIG. 1), the lighting controller 140 (FIG. 1), the thermal imager controller 150 (FIG. 1), the control system 220, and the user interface 292, while physically separate in some embodiments, may be viewed as a distributed system performing according to the system 500.

The system 500 contains a processor 502, a storage device 504, a memory 506 having software 508 stored therein that defines the abovementioned functionality, input and output (I/O) devices 510 (or peripherals), and a local bus, or local interface 512 allowing for communication within the system 500. The local interface 512 can be, for example but not limited to, one or more buses or other wired or wireless connections, as is known in the art. The local interface 512 may have additional elements, which are omitted for simplicity, such as controllers, buffers (caches), drivers, repeaters, and receivers, to enable communications. Further, the local interface 512 may include address, control, and/or data connections to enable appropriate communications among the aforementioned components.

The processor 502 is a hardware device for executing software, particularly that stored in the memory 506. The processor 502 can be any custom made or commercially available single core or multi-core processor, a central processing unit (CPU), an auxiliary processor among several processors associated with the present system 500, a semiconductor based microprocessor (in the form of a microchip or chip set), a microprocessor, or generally any device for executing software instructions.

The memory 506 can include any one or combination of volatile memory elements (for example, random access memory (RAM, such as DRAM, SRAM, SDRAM, etc.)) and nonvolatile memory elements (for example, ROM, hard drive, tape, CDROM, etc.). Moreover, the memory 506 may incorporate electronic, magnetic, optical, and/or other types of storage media. Note that the memory 506 can have a distributed architecture, where various components are situated remotely from one another, but can be accessed by the processor 502.

The software 508 defines functionality performed by the system 500, in accordance with the present invention. The software 508 in the memory 506 may include one or more separate programs, each of which contains an ordered listing of executable instructions for implementing logical functions of the system 500, as described below. The memory 506 may contain an operating system (O/S) 520. The operating system essentially controls the execution of programs within the system 500 and provides scheduling, input-output control, file and data management, memory management, and communication control and related services.

The I/O devices 510 may include input devices, for example but not limited to, a keyboard, mouse, scanner, microphone, etc. Furthermore, the I/O devices 510 may also include output devices, for example but not limited to, a printer, display, etc. Finally, the I/O devices 510 may further include devices that communicate via both inputs and outputs, for instance but not limited to, a modulator/demodulator (modem; for accessing another device, system, or network), a radio frequency (RF) or other transceiver, a telephonic interface, a bridge, a router, or other device.

When the system 500 is in operation, the processor 502 is configured to execute the software 508 stored within the memory 506, to communicate data to and from the memory 506, and to generally control operations of the system 500 pursuant to the software 508, as explained above.

The present invention is not limited to smart lighting fixtures. The multi-pixel thermal imaging device of the present invention may also be incorporated into other platforms that provide power and signaling infrastructure, for example, smoke detectors, particulate detectors, carbon monoxide (CO) detectors, gas alarms and the like.

The multi-pixel thermal imaging device may be a long-wavelength infrared sensor, for example, detecting in the range of 8-14 microns. In this range, the device works by using the natural heat emission (radiation) from warm objects, and therefore does not need an illumination source to operate. The imaging device can thus work independently of the lighting, night or day.

Returning to FIG. 1, the integrated lighting fixture and thermal imager device 100 has many advantages over the prior art. The integrated lighting fixture and thermal imager device 100 can be easily retrofitted in existing smart lighting infrastructure to provide heat sensing, monitoring of warm object, and occupancy checking as needed that would otherwise require costly actions such as but not limited to opening walls, ceilings, and running power (cables) to discrete heat sensing/monitoring/occupancy devices.

The integrated lighting fixture and thermal imager device 100 can be deployed in any new structure without incurring extra wiring and infrastructure cost above the wiring and infrastructure needed to support smart lighting solutions alone. For example, the structure of the communication interface 170 for handling commands may be shared by the plurality of light sources 120 and the heat sensing device 130, saving on infrastructure cost over the cost of installing and operating parallel control, communications for separate smart lighting and thermal sensing devices. Similarly, the structure of the power supply grid 160 is shared by the plurality of light sources 120 and the heat sensing device 130, providing cost savings in comparison with power infrastructure for separate smart lighting and thermal sensing devices.

The heat sensing device 130 provides several capabilities to the integrated lighting fixture and thermal imager 100, including, but not limited to, heat sensing, thermal imaging, and thermal location capabilities. These capabilities and others may be configured and tailored to specific heat sensing applications using firmware and application software, for example, as executed by the thermal imager controller 150.

The functionality of software executed by the systems 200, 400a, 400b and devices 100, 300 can be dynamically configured and/or reconfigured as needed, for example, according to the application. Examples of these heat sensing applications include determination of areas of elevated temperature ("hot spots"), to locate a person or animal in a building, or to locate a flame or other heat source. Heat sensing data and human and/or pet locations can be used to drive heating and/or cooling performance, for example, by feeding the heat sensing data into an environmental management system. For example, the sensing applications may use sensor data to determine and monitor the occupancy of a structure. The heating/cooling system may be configured to maintain a different set of temperatures in a heating zone depending upon whether or not the zone is occupied by a person. Heat sensing data may also be used by security functions in the overall building management, for example in security systems and/or home automation systems.

Returning to FIGS. 2, 4A and 4B, the overall networked control systems 200, 400a, 400b may configure, assign, and/or optimize functionality of the installed and recognized integrated lighting fixture and thermal imager devices 100, 300 automatically. For example, a commissioning system may be used to detect and/or configure functionality of one or more newly installed integrated lighting fixture and thermal imager device 100, 300 based on its location and/or proximity to other devices.

The overall networked control systems 200, 400a, 400b can alter the configuration of the integrated lighting fixture and thermal imager devices 100 dynamically as functions of detected parameters, for example, but not limited to, time, heat sensing patterns and varying occupancy.

The overall networked control systems 200, 400a, 400b may provide status updates and can be configured through a multitude of devices, for example, smart phones, tablets, and computers. These devices may be local to the systems 200, 400a, 400b, or remote and communicating via the internet. The overall networked systems 200, 400a, 400b may be provisioned to provide universal access, for example, to emergency responders. For example, emergency responders may access the systems 200, 400a, 400b to determine real-time and archived sensing data to determine the current and/or last known location of occupants, before even arriving at the premises.

The embodiments described herein provide capabilities to structures where it may be impractical or infeasible to provide parallel infrastructure for both smart lighting and thermal sensing systems. The integrated lighting fixture and thermal imager device 100, 300 may be configured to detect conditions specific to its location. For example, in a garage the integrated lighting fixture and thermal imager device 100, 300 firmware could be optimized to detecting a leak in a water heater, or a car left idling for an extended period of time. Integrated lighting fixture and thermal imager devices 100, 300 located in living and/or working spaces may be configured to detect heat in excess of body temperature, providing an early detection warning of unsafe conditions, for example, before smoke or other conditions might otherwise be detected.

The building control system 220 and/or individual integrated lighting fixture and thermal imager devices 100, 300 may have memory storage capacities, for example, to store a history of raw or derived heat sensing data, such as occupancy and/or activity. For example, changes in occupancy may be detected based on monitoring warm bodies, and the derived occupancy data may be stored in memory with a date stamp. Such memories may be used to establish patterns for use by security systems and/or emergency responders. Such an occupancy history may be useful to let first responders understand which portion of a building is typically occupied at a particular time of day or day of the week. This information may be particularly useful in emergency situations where the building temperature is elevated, masking the real-time location of individuals.

Security applications for the systems 200, 400a, 400b include determining if a person or animal has entered a facility thought to be unoccupied. For example, the systems 200, 400a, 400b may detect the body heat of an intruder, and pinpoint the location of the intruder within the facility. The location of the intruder may be monitored, for example, via application software hosted on a remote handheld device.

Figure 6:
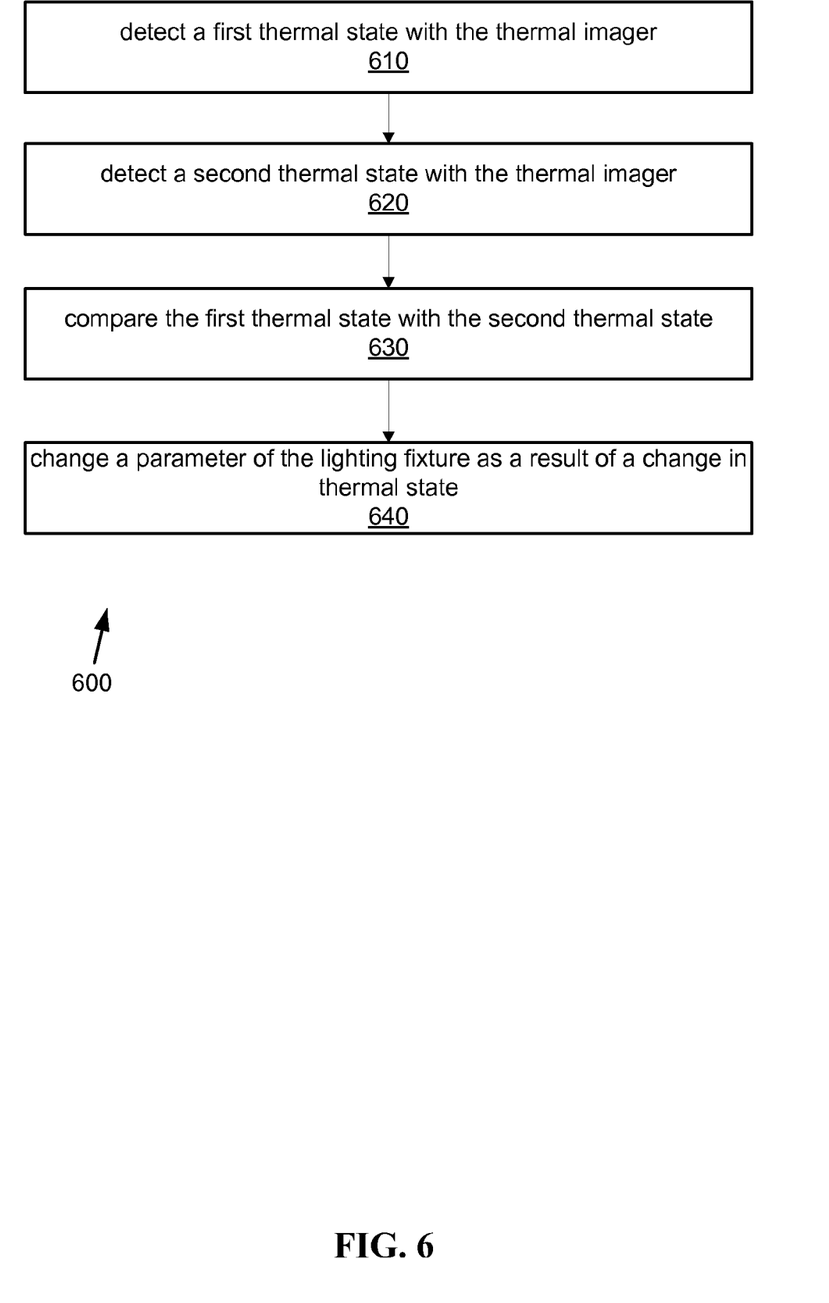
FIG. 6 is a flowchart of an exemplary method for controlling a lighting fixture having a solid state illumination device and a thermal imager.

FIG. 6 is a flowchart of an exemplary method 600 for controlling a lighting fixture 100 (FIG. 1), 300 (FIG. 3) having a solid state illumination device 120 (FIG. 3) and a thermal imager 130 (FIG. 3) with a multi-pixel heat sensing device source via a processor 302 (FIG. 3) configured to execute non-transitory instructions stored in a memory 306 (FIG. 3). It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

A first thermal state is detected with the thermal imager 130 (FIG. 3), as shown by block 610. The first thermal state may be a baseline reading to be used to compare to future readings. A second thermal state is detected with the thermal imager 130 (FIG. 3), as shown by block 620. The first thermal state is compared with the second thermal state, as shown by block 630. The comparison may be performed by an internal processor 302 (FIG. 3), or by an external device, such as a building control system 220 (FIG. 2) in communication with the lighting fixture 300 via a communication interface 170 (FIG. 3). In general, the comparison may indicate a change between the first thermal state and the second thermal state in the sensor field of the thermal imager 130 (FIG. 3), or no change. Examples of changes between the first thermal state and the second thermal state include a rise in ambient temperature, a fall in ambient temperature, a movement of a warm object from a first location to a second location, entry of a warm object into the sensor field of the thermal imager 130 (FIG. 3), exit of a warm object from the sensor field of the thermal imager 130 (FIG. 3), or other changes.

As a result of the detected second thermal state, a parameter of the lighting fixture 300 (FIG. 3) may be changed, as shown by block 640. For example, a rise in ambient temperature above a predetermined threshold may result in the processor 306 (FIG. 3) setting a parameter indicating an alarm condition, which may result in reporting the alarm condition to an external device, such as a building control system 220, or activation of a local alarm indicator, such as a light or sound signal. As another example, the detection of a warm object moving into the region monitored by the thermal imager 130 (FIG. 3) may result in setting a parameter to increase the illumination level of the illumination device 120 (FIG. 3).

The parameter change need not produce a visible or audible result. For example, a change in the ambient temperature or detected movement of a warm object may result in updating an internal parameter, such as an activity log stored in memory 306 (FIG. 3) within the lighting fixture 300 (FIG. 3). In implementations without internal memory, the change may be sent by a communication interface 170 (FIG. 1) within the lighting fixture to an external device, such as a building control system 220 (FIG. 2).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An integrated lighting fixture and thermal imager device comprising:
    a single housing containing:
        a single substrate comprising a printed circuit board, wherein the substrate is a thermally conductive and electrically insulating structure providing mechanical support;
        a solid state illumination source, comprising a plurality of light sources, mounted to the single substrate;
        a lighting controller mounted to the single substrate, which controls the solid state illumination source;
        a thermal imager comprising a multi-pixel heat sensing device mounted to the single substrate;
        a thermal imager controller configured to control an operating parameter of the thermal imager and read state information from the thermal imager;
        a communications interface in communication with the thermal imaging controller and/or in communication with the lighting controller, and capable of receiving commands from a building control system; and
        a power connection for connecting to a power supply grid, wherein connection to the power supply grid supplies power to the illumination source, the thermal imager, and the controller,
    the communications interface is configured to receive and route commands for the thermal imager from a remote device and convey information between the thermal imager controller and a remote device,
    wherein the integrated lighting fixture and thermal imager device is for connecting to a platform that provides both power and signaling infrastructure to the integrated lighting fixture and thermal imager device, and
    wherein control of the solid state illumination source by the lighting controller is defined, at least in part, by the received commands from the building control system.

2. The device of claim 1, wherein the communications interface is configured to convey state information received from the thermal imaging controller to the remote device.

3. The device of claim 1, wherein the thermal imaging controller further comprises a processor and a memory, wherein the processor is configured to execute non-transitory instructions stored in the memory.

4. The device as in any of claim 1 or 2-3, wherein the lighting controller operates independently from the thermal imaging controller.

5. A system comprising:
    an integrated lighting fixture and thermal imager device comprising:
        a single housing containing:
            a single substrate comprising a printed circuit board;
            a solid state illumination source mounted to the substrate;
            a thermal imager comprising a multi-pixel heat sensing device mounted to the single substrate;
            a thermal imager controller configured to control an operating parameter of the thermal imager and read state information from the thermal imager, and
            a power connection for connecting to a power supply grid, wherein connection to the power supply grid supplies power to the illumination source, the thermal imager, and the thermal imager controller;
    a device controller comprising a processor configured to execute non-transitory instructions stored in a memory and configured to communicate with and control the thermal imager; and
    a user interface in communication with the device controller,
    wherein the user interface is configured to control operation of the thermal imager via the device controller, and
    wherein the integrated lighting fixture and thermal imager device is for connecting to a platform that provides both power and signaling infrastructure to the integrated lighting fixture and thermal imager device.

6. The system of claim 5, wherein:
    the device further comprises an illumination controller configured to control the solid state illumination source; and
    the device controller is further configured to communicate with and control the illumination controller.

7. The device of claim 1, wherein the lighting controller operates independently from the thermal imaging controller, and wherein both the lighting controller and the thermal imaging controller are executed on a single processor, and wherein the communications interface is shared by both the lighting controller and the thermal imaging controller.

8. The device of claim 1, wherein the communication interface allows the building control system to operate the heat sensing device and/or the plurality of light source.

9. The device of claim 8, wherein the central building control system is in communication with the communication interface wirelessly.

10. A system comprising:
    a first integrated lighting fixture and thermal imager device comprising:

a first housing configured to contain:
   a first substrate comprising a printed circuit board;
   a first solid state illumination source mounted to the first substrate; and
   a first thermal imager comprising a multi-pixel heat sensing device mounted to the first substrate;
a second integrated lighting fixture and thermal imager device in communication with the first integrated lighting fixture and thermal imager device comprising:
a second housing configured to contain:
   a second substrate comprising a printed circuit board; and
   a second solid state illumination source mounted to the second substrate;
   a second thermal imager comprising a multi-pixel heat sensing device mounted to the second substrate;
a thermal imager controller comprising a processor configured to execute non-transitory instructions stored in a memory and to communicate with and control an operating parameter of the first and/or second thermal imager and read state information from the first and/or second thermal imager and to receive commands from a building control system;
at least one power connection for connecting to a power supply grid, wherein connection to the power supply grid supplies power to at least one of the first and second illumination sources, and at least one of the first and second thermal imagers;
and a user interface in communication with the controller, wherein the user interface is configured to control operation of the first thermal imager and the second thermal imager via the thermal imager controller, and wherein control of the first and second integrated lighting fixture and thermal imager devices by the controller is defined, at least in part, by the received commands from the building control system.

11. The integrated lighting fixture and thermal imager device of claim 1, wherein the operating parameter is configured to configure the thermal imager device to detect heat in excess of body temperature.

12. The system of claim 5, wherein the operating parameter is configured to configure the thermal imager device to detect heat in excess of body temperature.

13. The system of claim 10, wherein the operating parameter is configured to configure the first and/or second thermal imager device to detect heat in excess of body temperature.

* * * * *